(12) United States Patent
Ikeda et al.

(10) Patent No.: US 10,044,954 B2
(45) Date of Patent: Aug. 7, 2018

(54) SOLID-STATE IMAGING DEVICE, AD CONVERTER, AND ELECTRONIC APPARATUS

(71) Applicant: SONY CORPORATION, Tokyo (JP)

(72) Inventors: Yusuke Ikeda, Tokyo (JP); Daijiro Anai, Kanagawa (JP); Rei Yoshikawa, Kanagawa (JP)

(73) Assignee: Sony Corporation, Tokyo (JP)

( * ) Notice: Subject to any disclaimer, the term of this patent is extended or adjusted under 35 U.S.C. 154(b) by 0 days.

(21) Appl. No.: 15/326,542

(22) PCT Filed: Jul. 10, 2015

(86) PCT No.: PCT/JP2015/069830
§ 371 (c)(1),
(2) Date: Jan. 16, 2017

(87) PCT Pub. No.: WO2016/013413
PCT Pub. Date: Jan. 28, 2016

(65) Prior Publication Data
US 2017/0223292 A1    Aug. 3, 2017

(30) Foreign Application Priority Data
Jul. 25, 2014  (JP) .............................. 2014-152278

(51) Int. Cl.
*H04N 5/363* (2011.01)
*H04N 5/378* (2011.01)
*H01L 27/146* (2006.01)

(52) U.S. Cl.
CPC ....... *H04N 5/363* (2013.01); *H01L 27/14605* (2013.01); *H01L 27/14636* (2013.01); *H04N 5/378* (2013.01)

(58) Field of Classification Search
CPC .. H04N 5/363; H04N 5/378; H01L 27/14605; H01L 27/14636; H03M 1/00; H03M 1/12; H03M 1/56; H03M 1/825
(Continued)

(56) References Cited

U.S. PATENT DOCUMENTS

| 2012/0008028 A1* | 1/2012 | Egawa | H04N 5/378 348/300 |
| 2014/0022430 A1* | 1/2014 | Ueno | H04N 5/37455 348/308 |
| 2014/0375859 A1* | 12/2014 | Ono | H01L 27/14601 348/308 |

FOREIGN PATENT DOCUMENTS

| JP | 2013-90304 A | 5/2013 |
| JP | 2013-98895 A | 5/2013 |
| JP | 2014-23065 A | 2/2014 |

OTHER PUBLICATIONS

International Search Report prepared by the Japan Patent Office dated Sep. 7, 2015, for International Application No. PCT/JP2015/069830.

* cited by examiner

*Primary Examiner* — Lin Ye
*Assistant Examiner* — Chan Nguyen
(74) *Attorney, Agent, or Firm* — Sheridan Ross P.C.

(57) ABSTRACT

The present disclosure relates to a solid-state imaging device, an AD converter, and an electronic apparatus that improve a crosstalk characteristic. The AD converter includes a comparator that compares the pixel signal with the reference signal, a pixel signal side capacitor, and a reference signal side capacitor. The pixel signal side capacitor and the reference signal side capacitor are formed such that a first parasitic capacity, and a second parasitic capacity (Continued)

are substantially the same. The present technology is applicable to a CMOS image sensor, for example.

7 Claims, 8 Drawing Sheets

(58) Field of Classification Search
USPC .......................................................... 348/241
See application file for complete search history.

SOLID-STATE IMAGING DEVICE, AD CONVERTER, AND ELECTRONIC APPARATUS

This application is a national stage application under 35 U.S.C. 371 and claims the benefit of PCT Application No. PCT/JP2015/069830 having an international filing date of 10 Jul. 2015, which designated the United States, which PCT application claimed the benefit of Japanese Patent Application No. 2014-152278 filed 25 Jul. 2014, the disclosures of which are incorporated herein by reference in their entirety.

TECHNICAL FIELD

The present disclosure relates to a solid-state imaging device, an AD converter, and an electronic apparatus, in particular to a solid-state imaging device, an AD converter, and an electronic apparatus that improve a crosstalk characteristic.

BACKGROUND ART

In an electronic apparatus in the related art having an imaging function such as a digital still camera and a digital video camera, a solid-state imaging device such as a CCD (Charge Coupled Device) and CMOS (Complementary Metal Oxide Semiconductor) image sensor is used. The solid-state imaging device has pixels where PDs (photodiodes) for performing a photoelectric conversion and a plurality of transistors are combined, and an image is constructed on the basis of pixel signals output from the plurality of pixels planarly disposed. In addition, the pixel signals output from the pixels are AD-converted by a plurality of AD (Analog to Digital) converters disposed for every column of the pixels, and are output.

In recent years, along with downsizing an electronic apparatus mounting the solid-state imaging device, the solid-state imaging device is downsized or the area of the solid-state imaging device is reduced. Pitch space where the pixels and the AD converters are disposed are narrowed. It causes a crosstalk between the adjacent pixels or the adjacent AD converters. As a countermeasure, the crosstalk between the pixels is improved by introducing a process for forming a trench at a boundary between the pixels.

Furthermore, the present applicant suggests, for example, an imaging apparatus having an improved crosstalk characteristic by differentiating arrangement patterns of a plurality of divided transistors configuring comparators in a predetermined column from arrangement patterns of a plurality of divided transistors configuring comparators in a column adjacent to the predetermined column (see Patent Literature 1, for example).

CITATION LIST

Patent Literature

Patent Literature 1: Japanese Patent Application Laid-open No. 2014-23065

DISCLOSURE OF INVENTION

Technical Problem

As described above, although the crosstalk characteristic is tried to be improved in the related art, it is difficult to inhibit a crosstalk generated by coupling due to a parasitic capacity between capacities of an AD converter, for example.

The present disclosure is made in view of the circumstances, and is to further improve the crosstalk characteristic.

Solution to Problem

A solid-state imaging device according to an aspect of the present disclosure includes a pixel region including a plurality of pixels that output pixel signals corresponding to an amount of irradiated light, the plurality of pixels being disposed in an array, a column signal processing circuit that AD-converts the pixel signals in parallel by a plurality of AD (Analog to Digital) converters, the number of the plurality of AD converters corresponding to the number of columns of the pixels, and a reference signal generating circuit that generates a reference signal to which the AD converter refers when the AD converter AD-converts the pixel signals, in which each of the AD converters includes a comparator that compares the pixel signal with the reference signal, a pixel signal side capacitor connected between a pixel-signal signal line that transmits the pixel signals and one input terminal of the comparator, and a reference signal side capacitor connected between a reference-signal signal line that transmits the reference signal and another input terminal of the comparator, and the pixel signal side capacitor and the reference signal side capacitor are formed such that a first parasitic capacity generated between a node at a pixel signal line side of the pixel signal side capacitor connected to an adjacent other AD converter and a node at a comparator side of the reference signal side capacitor, and a second parasitic capacity generated between the node at a pixel signal line side of the pixel signal side capacitor connected to the adjacent other AD converter and a node at a comparator side of the pixel signal side capacitor are substantially the same.

An AD converter according to an aspect of the present disclosure includes a comparator that compares a first signal with a second signal, a first signal side capacitor connected between a first-signal signal line that transmits the first pixel signal and one input terminal of the comparator, and a second signal side capacitor connected between a second-signal signal line that transmits the second signal and another input terminal of the comparator, the first signal side capacitor and the second signal side capacitor are formed such that a first parasitic capacity generated between a node at a first signal line side of a first signal line side capacitor connected to an adjacent other AD converter and a node at a comparator side of the second signal side capacitor, and a second parasitic capacity generated between the node at the first signal line side of the first signal side capacitor connected to the adjacent other AD converter and a node at a comparator side of the first signal side capacitor are substantially the same.

An electronic apparatus according to an aspect of the present disclosure includes a solid-state imaging device, including a pixel region including a plurality of pixels that output pixel signals corresponding to an amount of irradiated light, the plurality of pixels being disposed in an array, a column signal processing circuit that AD-converts the pixel signals in parallel by a plurality of AD converters, the number of the plurality of AD converters corresponding to the number of columns of the pixels, and a reference signal generating circuit that generates a reference signal to which the AD converter refers when the AD converter AD-converts the pixel signals, in which each of the AD converter includes a comparator that compares the pixel signal with the reference signal, a pixel signal side capacitor connected between a pixel-signal signal line that transmits the pixel signals and one input terminal of the comparator, and a reference signal side capacitor connected between a reference-signal signal line that transmits the reference signal and another input terminal of the comparator, and the pixel signal side capacitor and the reference signal side capacitor are formed such that a first parasitic capacity generated between a node at a pixel signal line side of the pixel signal side capacitor connected to an adjacent other AD converter and a node at a comparator side of the reference signal side capacitor, and a second parasitic capacity generated between the node at a pixel signal line side of the pixel signal side capacitor connected to the adjacent other AD converter and a node at a comparator side of the pixel signal side capacitor are substantially the same.

An aspect of the present disclosure includes a comparator that compares a pixel signal (a first signal) with a reference signal (a second signal), a pixel signal side capacitor connected between a pixel-signal signal line that transmits the pixel signals and one input terminal of the comparator, and a reference signal side capacitor connected between a reference-signal signal line that transmits the reference signal and another input terminal of the comparator, the pixel signal side capacitor and the reference signal side capacitor are formed such that a first parasitic capacity generated between a node at a pixel signal line side of the pixel signal side capacitor connected to an adjacent other AD converter and a node at a comparator side of the reference signal side capacitor, and a second parasitic capacity generated between the node at a pixel signal line side of the pixel signal side capacitor connected to the adjacent other AD converter a the node at a comparator side of the pixel signal side capacitor are substantially the same.

Advantageous Effects of Invention

According to the aspect of the present disclosure, the crosstalk characteristic can be improved.

MODE(S) FOR CARRYING OUT THE INVENTION

Hereinafter, specific embodiments to which the present technology is applied will be described in detail referring to drawings.

Figure 1:
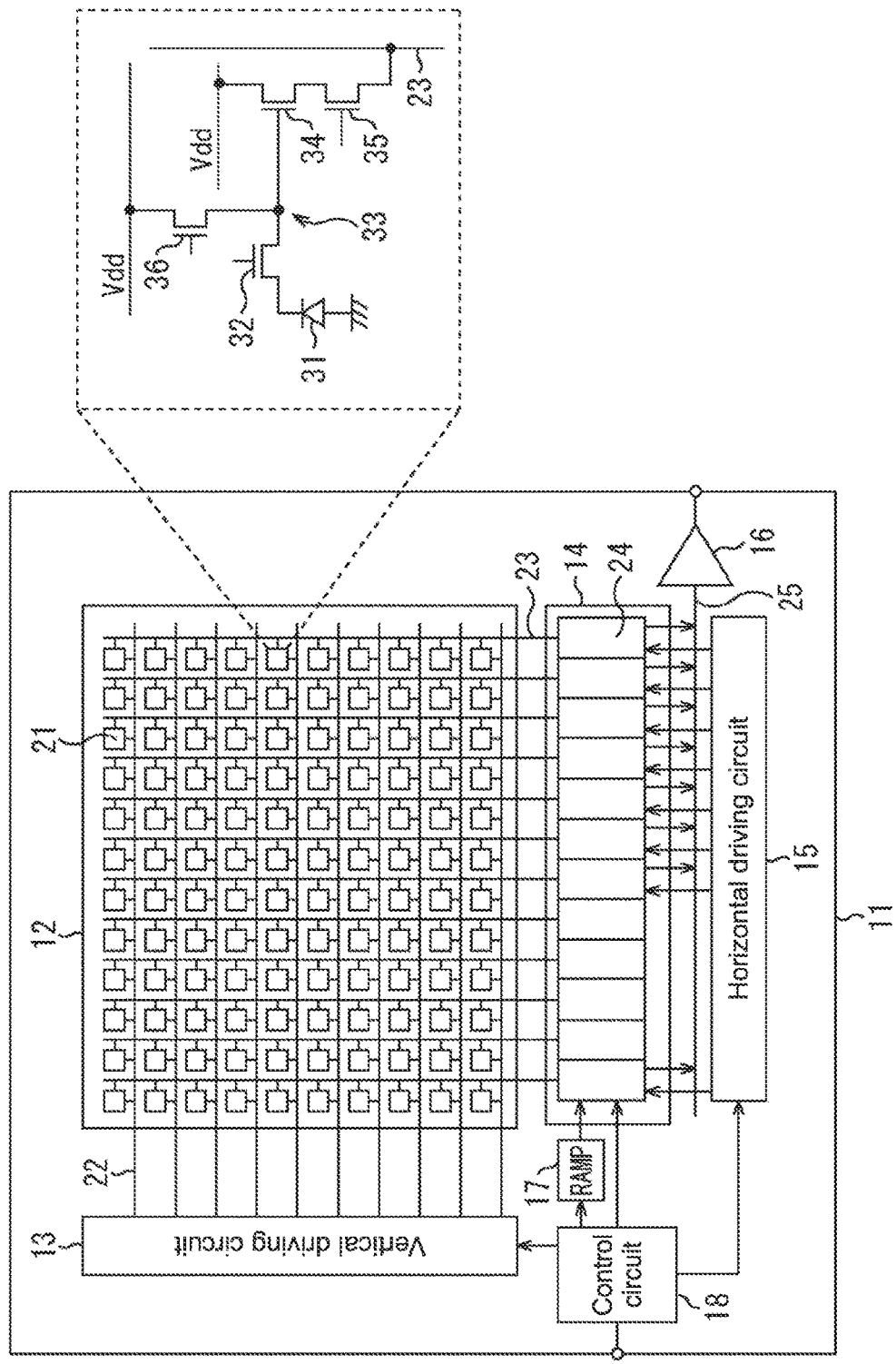
FIG. 1 is a block diagram showing a configuration example of an embodiment of a solid-state imaging device to which the present technology is applied.

FIG. 1 is a block diagram showing a configuration example of an embodiment of a solid-state imaging device to which the present technology is applied.

In FIG. 1, a solid-state imaging device 11 includes a pixel region 12, a vertical driving circuit 13, a column signal processing circuit 14, a horizontal driving circuit 15, an output circuit 16, a ramp signal generating circuit 17, and a control circuit 18.

A plurality of pixels 21 are disposed on the pixel region 12 in an array. Each pixel 21 is connected to the vertical driving circuit 13 via a horizontal signal line 22, and to the column signal processing circuit 14 via a vertical signal line 23. Each of the plurality of pixels 21 outputs a pixel signal corresponding to an amount of light irradiated via an optical system (not shown). From the pixel signals, an image of an object to be imaged on the pixel region 12 is constructed.

The pixel 21 is, for example, configured as enlargedly shown at a right side of FIG. 1. A charge generated at a PD 31 that is a photoelectric conversion unit is transferred to an FD (Floating Diffusion) 33 that is a floating diffusion region via a transfer transistor 32 through driving by a vertical driving circuit 13. Thereafter, when the pixel 21 is subject to be read-out, a selection transistor 35 is turned on through driving by the vertical driving circuit 13. A pixel signal (D phase) at a signal level corresponding to the charge accumulated on the PD 33 is output to the vertical signal line 23 from the amplification transistor 34 via the selection transistor 35. Also, when the reset transistor 36 is turned on, the charge accumulated on an FD 33 is reset, and the pixel signal (P phase) at a reset level is output to the vertical signal line 23 from the amplification transistor 34 via the selection transistor 35.

The vertical driving circuit 13 sequentially feeds a driving signal for driving (transferring, selecting, resetting, etc.) each pixel 21 to the pixel 21 via the horizontal signal line 22 for every row of the plurality of the pixels 21 disposed on the pixel region 12.

The column signal processing circuit 14 performs CDS (Correlated Double Sampling) processing on the pixel signals output from the plurality of the pixels 21 via the vertical signal line 23, thereby AD-converting the pixel signal and removing the reset noise. For example, the column signal processing circuit 14 includes a plurality of AD converters 24, the number of the plurality of AD converters corresponding to the number of columns of the pixels 21, and can perform the CDS processing in parallel for every column of the pixels 21. Specifically, in the column signal processing circuit 14, the pixel signal in the P phase output from the pixel 21 is AD-converted at the AD converter 24, and the pixel signal in the D phase output from the pixel 21 is AD-converted at the AD converter 24. Thereafter, a difference between the pixel signals is determined.

The horizontal driving circuit 15 sequentially feeds a driving signal for outputting a pixel signal from the column signal processing circuit 14 to a data output signal line 25 to the column signal processing circuit 14 for every column of the plurality of the pixels 21 disposed on the pixel region 12.

The output circuit 16 amplifies the pixel signal fed from the column signal processing circuit 14 via the data output signal line 25 at a timing according to the driving signal of the horizontal driving circuit 15, and outputs it to an image processing circuit at a later stage.

The ramp signal generating circuit 17 generates a ramp signal (RAMP) having a descending waveform according to an elapsed time at a constant slope as a reference signal that is referred by the column signal processing circuit 14 when the pixel signal is AD-converted, and feeds it to the column signal processing circuit 14.

The control circuit 18 controls a drive of each block inside of the solid-state imaging device 11. For example, the control circuit 18 generates a clock signal according to a driving cycle of each block, and feeds it to each block.

The solid-state imaging device 11 is configured as described above. The pixel signal output in order from the plurality of the pixels 21 in one column connected to one vertical signal line 23 is AD-converted at the AD converter 24 connected to the vertical signal line 23. Thus, a set in a vertical direction including the plurality of pixels 21 in one column connected to one vertical signal line 23 and the AD converter 24 is hereinafter referred to as a "column".

In the meantime, along with downsizing the solid-state imaging device 11 or along with reducing an area of the solid-state imaging device 11, a pitch space between columns in a horizontal direction is narrowed. It is concerned that a crosstalk is generated between the adjacent columns. Accordingly, the solid-state imaging device 11 is configured to inhibit the crosstalk from generating.

Figure 2:
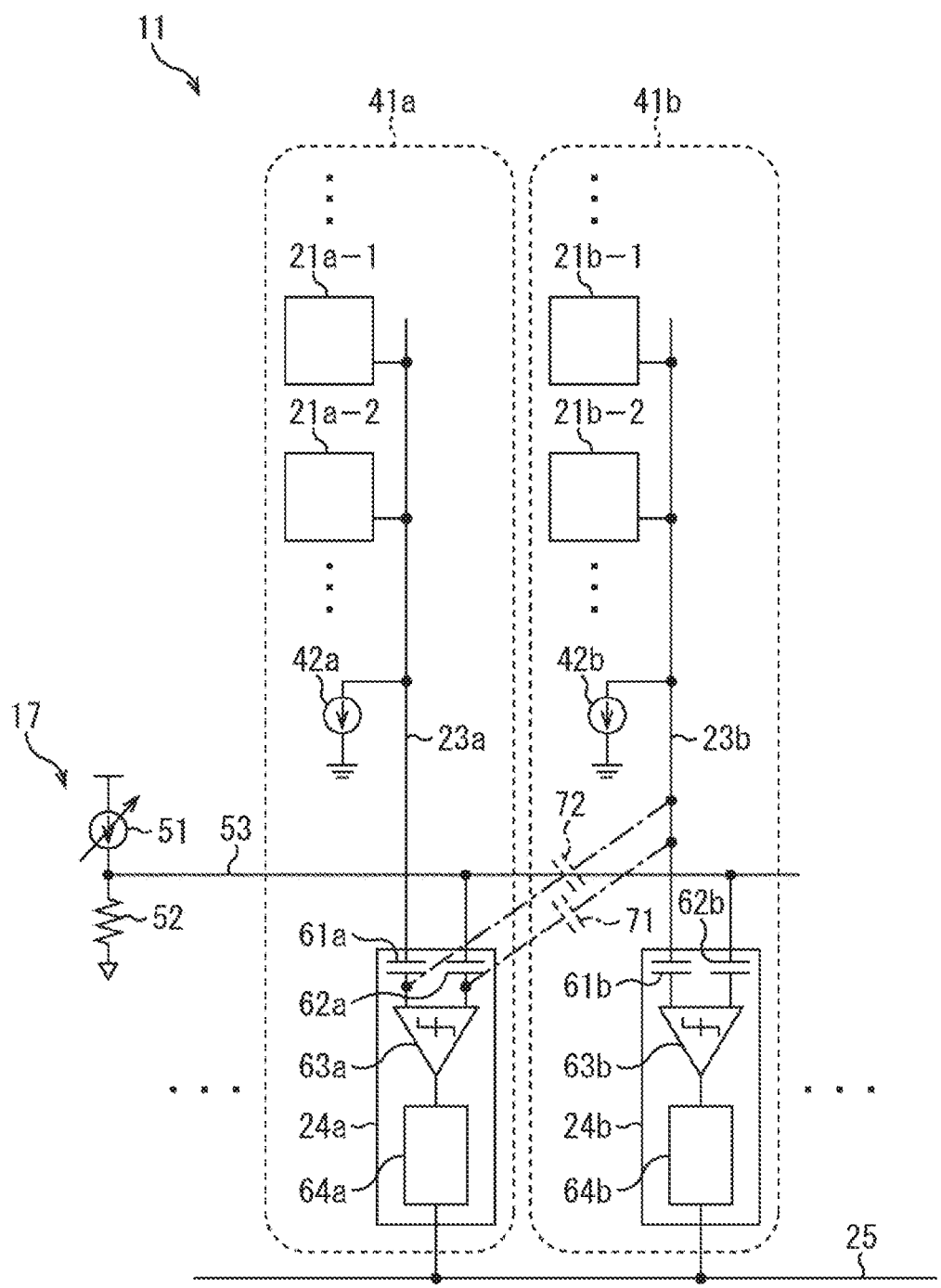
FIG. 2 is a diagram for explaining a configuration of columns of the solid-state imaging device.

Referring to FIG. 2, a column configuration of the solid-state imaging device 11 will be described.

FIG. 2 shows a column 41a disposed in an even number column and a column 41b disposed in an odd number from the plurality of columns 41 disposed along a horizontal direction of the solid-state imaging device 11, for example.

In the column 41a, a plurality of pixels 21a (two pixels 21a-1 and 21a-2 in FIG. 2) and a constant current source 42a are connected to a vertical signal line 23a, and an AD converter 24a is connected to an end of the vertical signal line 23a. Similarly, in the column 41b, a plurality of pixels 21b (two pixels 21b-1 and 21b-2 in FIG. 2) and a constant current source 42b are connected to a vertical signal line 23b, and an AD converter 24b is connected to an end of the vertical signal line 23b. In addition, the ramp signal generating circuit 17 includes a variable current source 51 and a resistance 52. A ramp signal generated in the ramp signal generating circuit 17 is fed to the AD converters 24a and 24b via the ramp signal line 53.

The AD converter 24a includes two capacitors 61a and 62a, a comparator 63a, and a counter 64a.

One node of the capacitor 61a is connected to the vertical signal line 23a, and the other node of the capacitor 61a is connected to an input terminal of the comparator 63a. The capacitor 61a at a vertical signal line side holds a potential corresponding to the pixel signal fed via the vertical signal line 23a.

One node of the capacitor 62a is connected to the ramp signal line 53, and the other node of the capacitor 62a is connected to an input terminal of the comparator 63a. The capacitor 62a at a ramp signal line side holds a potential according to a ramp signal fed via the ramp signal line 53.

The potential corresponding to the pixel signal held by the capacitor 61a and the potential corresponding to the ramp signal held by the capacitor 62a are input to the comparator 63a. The comparator 63a outputs a comparison result signal as a result of comparing the potentials. For example, the comparator 63a outputs the comparison result signal that is reversed at a timing where a potential corresponding to a ramp signal having a waveform of dropping at a constant slope becomes lower than a potential corresponding to the pixel signal.

The counter 64a counts a timing from the start of dropping the ramp signal to the reverse of the comparison result signal output from the comparator 63a, for example, and outputs the count value to the data output signal line 25 as a value that the pixel signal is AD-converted.

The AD converter 24b includes two capacitors 61b and 62b, a comparator 63b, and a counter 64b similarly to the AD converter 24a, and the detailed description about the structure thereof will be therefore omitted.

Furthermore, in the solid-state imaging device 11, along with narrowing a pitch space between columns 41, a parasitic capacity 71 will be generated between a node at a comparator 63a side of the capacitor 62a and a node at a vertical signal line 23b side of the capacitor 61b. Accordingly, in the solid-state imaging device 11, the capacitor 61a and the capacitor 62a are formed so as to generate a parasitic capacity 72 that is substantially the same as the parasitic capacity 71 between a node at a comparator 63a side of the capacitor 61a and a node at a vertical signal line 23b side of the capacitor 61b.

Thus, by forming the capacitor 61a and the capacitor 62a such that the parasitic capacity 71 and the parasitic capacity 72 become substantially the same, a crosstalk, for example, can be prevented from generating by the effect of the pixel signal transmitted via the vertical signal line 23b of the column 41b on the pixel signal output from the column 41a. In this manner, the solid-state imaging device 11 can improve a crosstalk characteristic.

For example, as compared with a solid-state imaging device 11' having the related art configuration shown in FIG. 3, the generation of a crosstalk will be described. In the solid-state imaging device 11' shown in FIG. 3, the components common to the solid-state imaging device 11 in FIG. 2 are denoted by the same reference numerals, and thus detailed description thereof will be hereinafter omitted.

Figure 3:
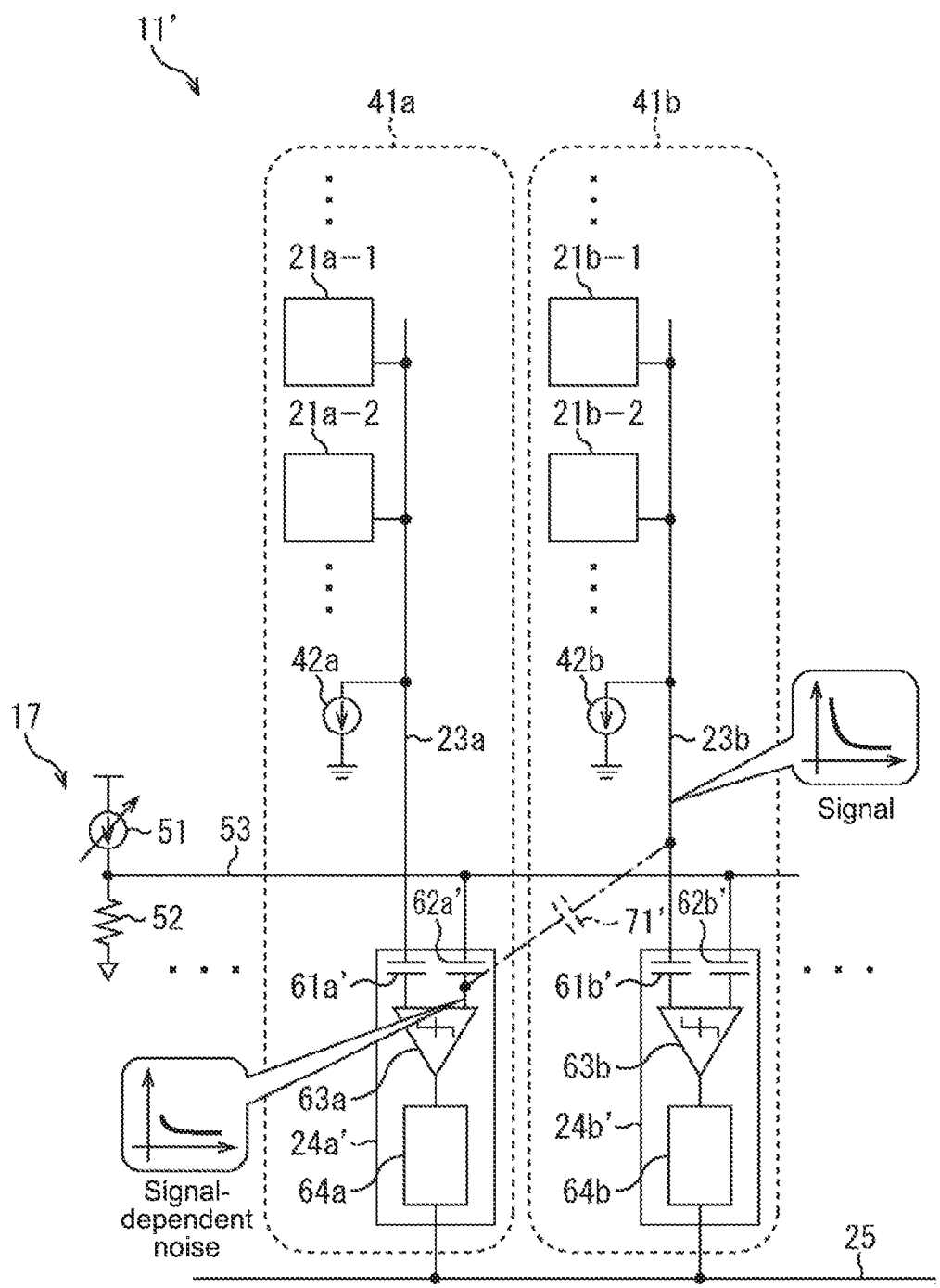
FIG. 3 is a block diagram showing a configuration example of a solid-state imaging device in the related art.

As shown in FIG. 3, along with narrowing a pitch space between columns 41, in the solid-state imaging device 11' in the related art, the parasitic capacity 71' will be generated only between a node at a comparator 63a side of the capacitor 62a' and a node at a vertical signal line 23b side of the capacitor 61b'. This is because a layout is such that the capacitor 62a' is disposed at a column 41b side, i.e., nearer to the vertical signal line 23b than the capacitor 61a'.

When such parasitic capacity 71' is generated when, for example, the pixel signal is transmitted via the vertical signal line 23b of the column 41b that is greater than the pixel signal transmitted via the vertical signal line 23a of the column 41a, a signal-dependent noise (error voltage) dependent on the greater pixel signal is undesirably input to the comparator 63a via the parasitic capacity 71'. In the solid-state imaging device 11' in the related art, a crosstalk characteristic is thus lowered.

Such parasitic capacity 71' tends to be increased when the capacitor 61 and the capacitor 62 adopt a MOM (Metal Oxide Metal) capacity where a metal wiring sandwiches an insulation layer and use a multilayer wiring. As a result, the crosstalk characteristic is greatly affected.

Figure 4:
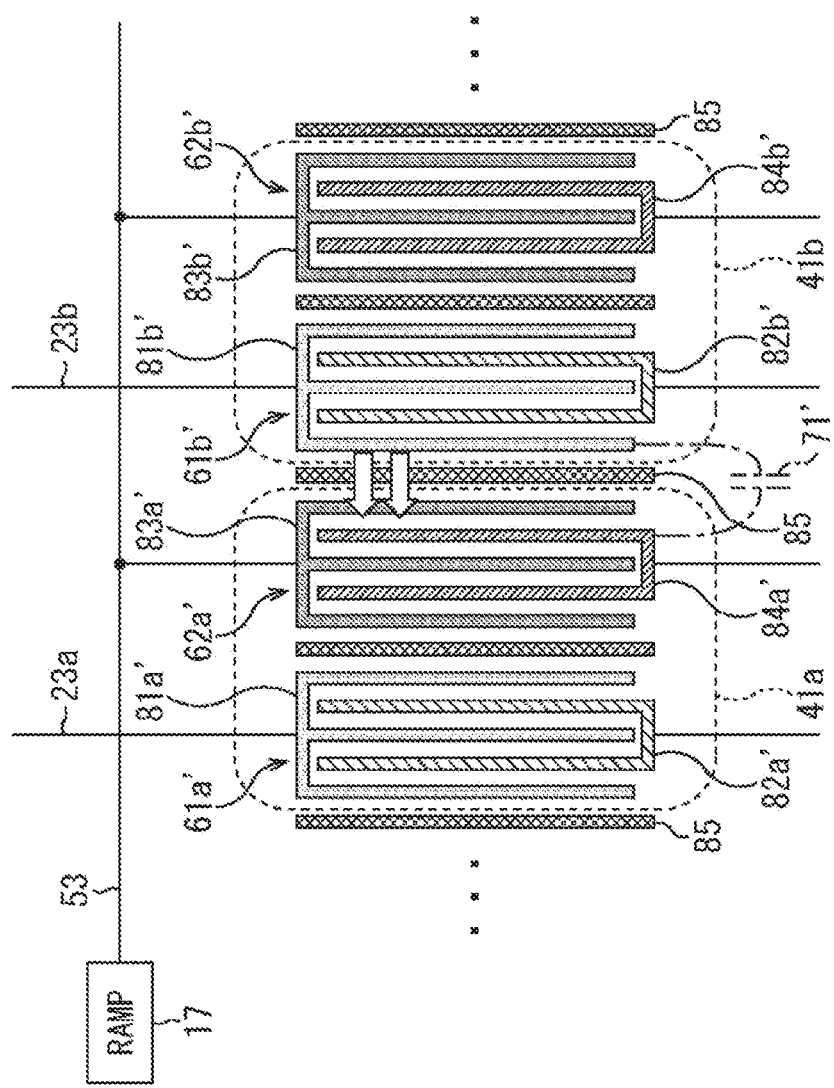
FIG. 4 is a diagram showing a planar layout of a capacitor in the solid-state imaging device in the related art.

Here, FIG. 4 shows a planar layout of the capacitor 61' and the capacitor 62' of the solid-state imaging device in the related art.

As shown in FIG. 4, the capacitor 61a' includes a comb-shaped metal wiring 81a' connected to the vertical signal line 23a and a comb-shaped metal wiring 82a' connected to the comparator 63a. The metal wiring 81a' and the metal wiring 82a' include a plurality of elongated comb-shaped teeth so as to be extended in a vertical direction from the vertical signal line 23a to the comparator 63a, and the teeth are alternately disposed so as to sandwich the insulation layer. In the example shown in FIG. 4, three teeth are formed in the metal wiring 81a', and two teeth are formed in the metal wiring 82a'.

Also, the capacitor 62a' includes a comb-shaped metal wiring 83a' connected to the ramp signal generating circuit 17 and a comb-shaped metal wiring 84a' connected to the comparator 63a. The metal wiring 83a' and the metal wiring 84a' include a plurality of elongated comb-shaped teeth so as to be extended in a vertical direction similar to the metal wiring 81a' and the metal wiring 82a', and the teeth are alternately disposed so as to sandwich the insulation layer.

Thus, in the column 41a, the capacitor 61a' and the capacitor 62a' are formed so as to sandwich the insulation layer between the metal wirings.

In the column 41b, similar to the column 41a, the capacitor 61b' includes a metal wiring 81b' connected to the vertical signal line 23b, and a metal wiring 82b' connected to the comparator 63b. Also, the capacitor 62b' includes a metal wiring 83b' connected to the ramp signal generating circuit 17, and a metal wiring 84b' connected to the comparator 63b.

Even if a shield 85 is disposed between the column 41a and the column 41b configured in this way, the characteristic is indispensably affected by a fringe component of the MOM capacity. Therefore, it is difficult to prevent the parasitic capacity 71' from generating between the metal wiring 84a' connected to the comparator 63a and the metal wiring 81b' connected to the vertical signal line 23b.

In contrast, in the solid-state imaging device 11 according to the present embodiment, not preventing the parasitic capacity 71' from generating, as described above referring to FIG. 2, the capacitor 61a and the capacitor 62a are formed so as to make the parasitic capacity 71 and the parasitic capacity 72 substantially the same.

Figure 5:
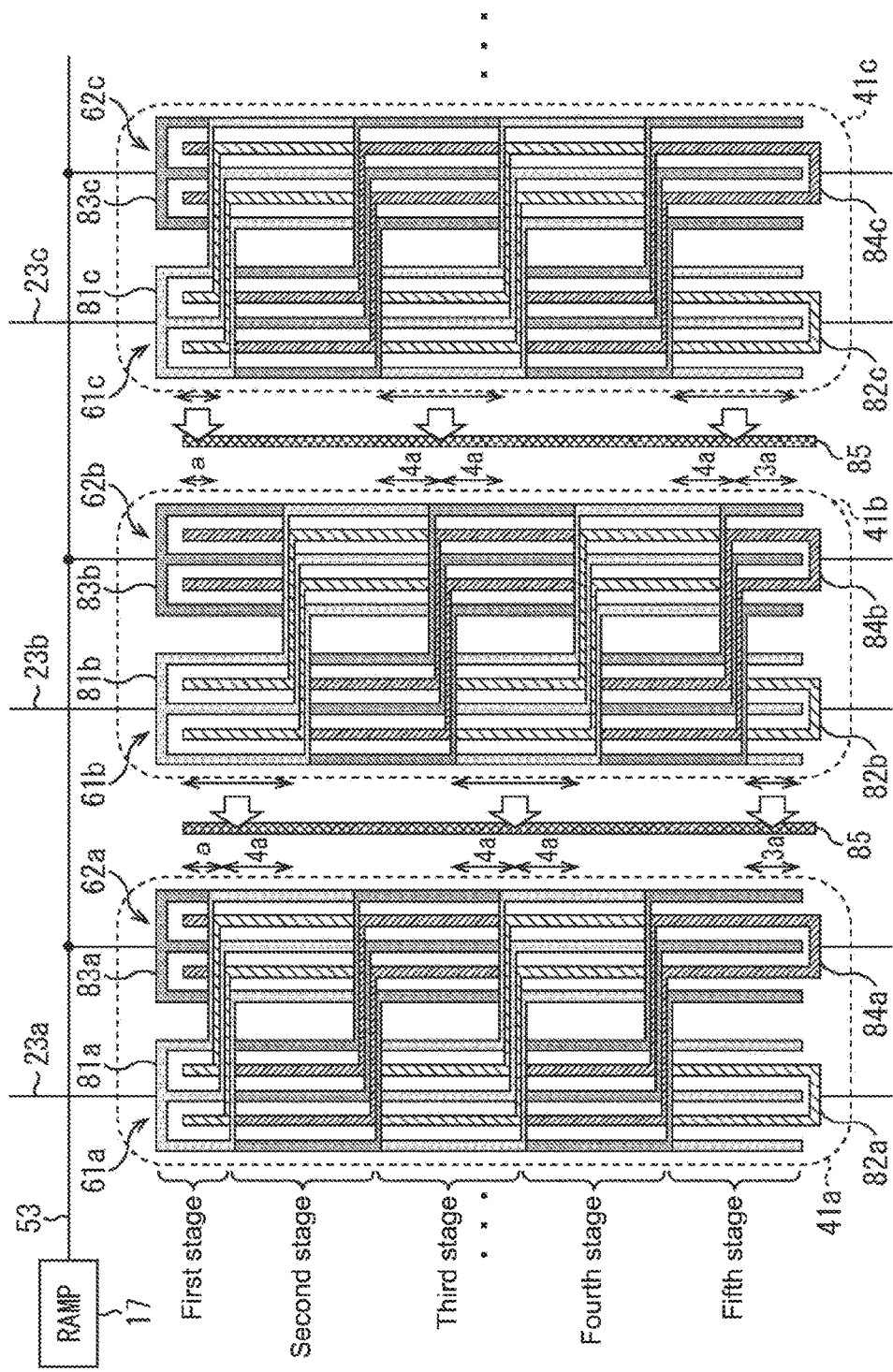
FIG. 5 is a diagram showing a planar layout of the capacitor.

Next, FIG. 5 shows a planar layout of the capacitor 61 and the capacitor 62.

As shown in FIG. 5, the capacitor 61a includes a comb-shaped metal wiring 81a connected to the vertical signal line 23a and a comb-shaped metal wiring 82a connected to the comparator 63a. The metal wiring 81a and the metal wiring 82a have a plurality of elongated comb-shaped teeth extending in a vertical direction from the vertical signal line 23a to the comparator 63a, and the teeth are alternately disposed to sandwich the insulation layer. In the embodiment in FIG. 5, the metal wiring 81a has three teeth, and the metal wiring 82a has two teeth.

The capacitor 62a includes the comb-shaped metal wiring 83a connected to the ramp signal generating circuit 17 and the comb-shaped metal wiring 84a connected to the comparator 63a. Similar to the metal wiring 81a and the metal wiring 82a, the metal wiring 83a and the metal wiring 84a have a plurality of elongated comb-shaped teeth extending in the vertical direction, and the teeth are alternately disposed to sandwich the insulation layer.

In addition, the capacitor 61a and the capacitor 62a are formed to partly and alternately interchange their positions. At this time, a part where their positions are interchanged is formed such that a total length of a part of the capacitor 61 being close to the capacitor 61b and a total length of a part of the capacitor 62a being close to the capacitor 61b are substantially the same.

For example, in the embodiment in FIG. 5, in a first stage at a pixel region 12 side, a length of a part of the capacitor 62a being close to the capacitor 61b is denoted as "a". It is formed such that, in a second stage, a length of a part of the capacitor 61a being close to the capacitor 61b becomes "4a". Furthermore, it is formed such that, in a third stage, a length of a part of the capacitor 62a being close to the capacitor 61b becomes "4a", and, in a fourth stage, a length of a part of the capacitor 61a being close to the capacitor 61b becomes "4a". In addition, it is formed such that, in a fifth stage, a length of a part of the capacitor 62 being close to the capacitor 61b becomes "3a". By designing as described above, as a whole, the total length of a part of the capacitor 62a being close to the capacitor 61b becomes "8a", and the total length of a part of the capacitor 61a being close to the capacitor 61b becomes "8a".

Thus, in the column 41a, it is formed such that the total length of a part of the capacitor 61a being close to the capacitor 61b and the total length of a part of the capacitor 62a being close to the capacitor 61b are the same, "8a", whereby the parasitic capacity 71 and the parasitic capacity 72 are substantially the same. This prevents the crosstalk from being generated between the column 41a and the column 41b.

Similarly, as to the column 41b, between the column 41b and the adjacent column 41c, a part where their positions are interchanged is formed such that a total length of a part of the capacitor 61b being close to the capacitor 61c and a total length of a part of the capacitor 62b being close to the capacitor 61b are substantially the same. Specifically, in the embodiment in FIG. 5, a total length of a part of the capacitor 62b being close to the capacitor 61c becomes "8a", and a total length of a part of the capacitor 61b being close to the capacitor 61c becomes "8a".

Accordingly, it is possible to prevent the crosstalk from being generated between the column 41b and the column 41c. The column 41c is disposed in the even number column similar to the column 41a, and the capacitors 61c and 62c are respectively formed in a similar layout to the capacitors 61a and 62a.

Furthermore, a column (not shown) disposed in an odd number column adjacent to the column 41c is formed similar to the column 41b. In summary, in the solid-state imaging device 11, the capacitors 61 and 62 have a same layout in the AD converters 24 disposed in the odd number columns, and have a same layout in the AD converters 24 disposed in the even number columns.

In addition, in FIG. 5, at the part where the positions of the capacitor 61a and the capacitor 62a are interchanged, the metal wirings 81a to 84a configuring respective capacitors are shown overlapped. However, the capacitor 61a and the capacitor 62a are actually includes multilayer wiring layers. Accordingly, the metal wirings 81a to 84a are configured to be overlapped on different wiring layers, thereby partly interchanging the positions of the capacitor 61a and the capacitor 62a. Also, in FIG. 5, although a flat layout is shown, plural layers of the metal wirings 81a to 84a having the similar layout are formed, thereby increasing the capacity of the capacitor 61a and the capacitor 62a. In this case, the positions of the capacitor 61a and the capacitor 62a are partly interchanged at all wiring layer, similar to the layout shown in FIG. 5. The similar configuration may be applied to the capacitor 61b and the capacitor 62b.

As described above, in the solid-state imaging device 11, the parasitic capacity is coupled evenly between the capacitor 61a and the capacitor 61b, and between the capacitor 62a and the capacitor 61b, thereby reducing the generation of the crosstalk. Specifically, a differential signal input to the comparator 63a connected to the capacitor 61a and the capacitor 62a is taking into consideration. The effect of the parasitic capacity may be the same and canceled between the differences, thereby greatly reducing the crosstalk.

Consequently, by the solid-state imaging device 11, the crosstalk characteristic can be improved without increasing a layout size, as compared with the configuration that the crosstalk characteristic is improved by widen the spaces between the columns, for example.

Also, the solid-state imaging device 11 having the above-described configuration can adopt a pixel sharing structure including a predetermined number of pixels 21 sharing the FD 33, for example. Furthermore, the solid-state imaging device 11 can be used for capturing an HDR (High Dynamic Range) image representing a wide dynamic range on the basis of the pixel signal read-out from the pixels 21 to which short-time exposure is applied and from the pixels 21 to which long-time exposure is applied.

In the related art, in the solid-state imaging device 11 adopting the pixel sharing structure, when the HDR image is captured using a read-out method to read out a pixel signal by storing a charge in the FD 33, the crosstalk may greatly affect as described above.

Figure 6:
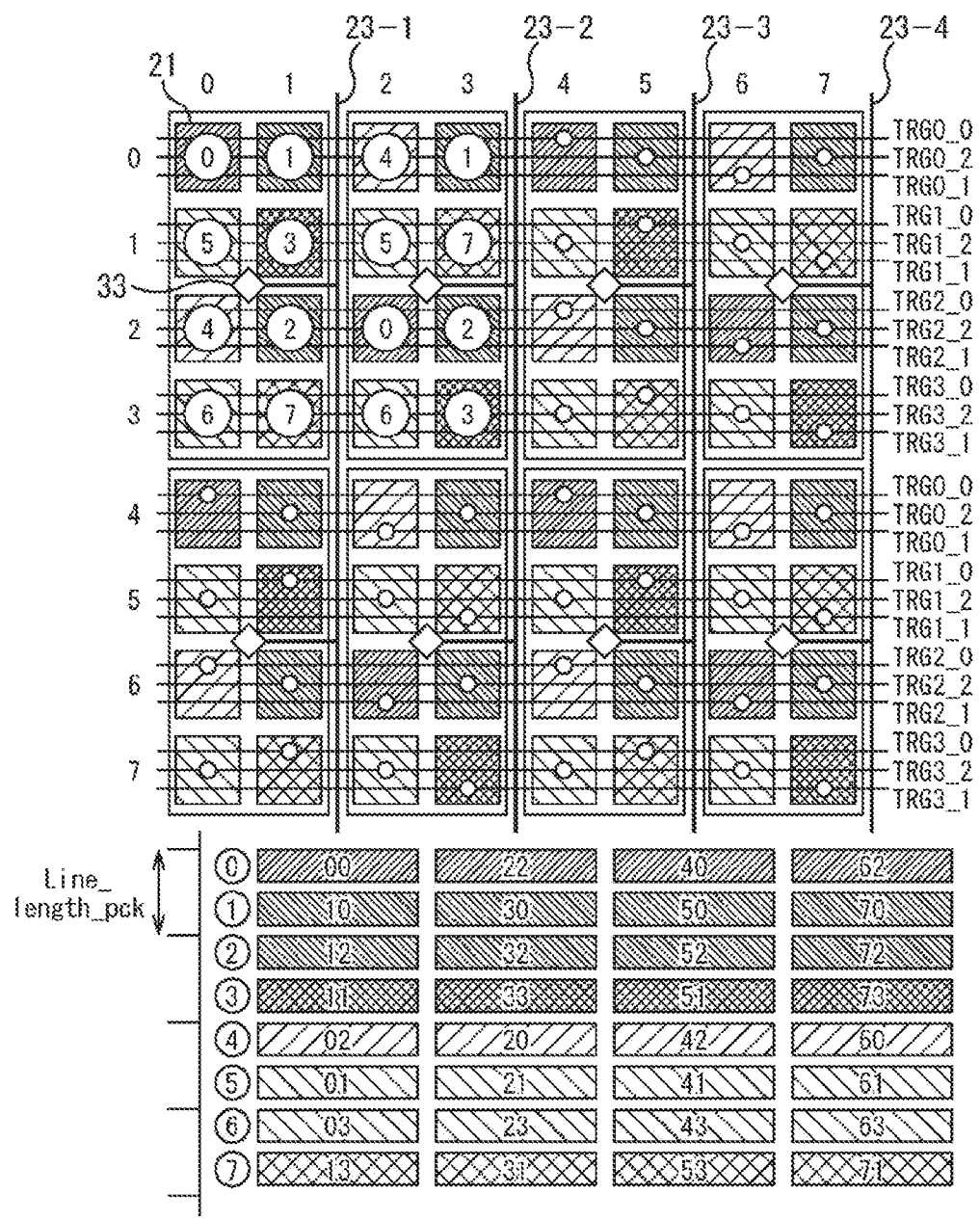
FIG. 6 is a drawing for explaining a read-out method to read out a pixel signal of each of all pixels when an HDR image is captured.
Figure 7:
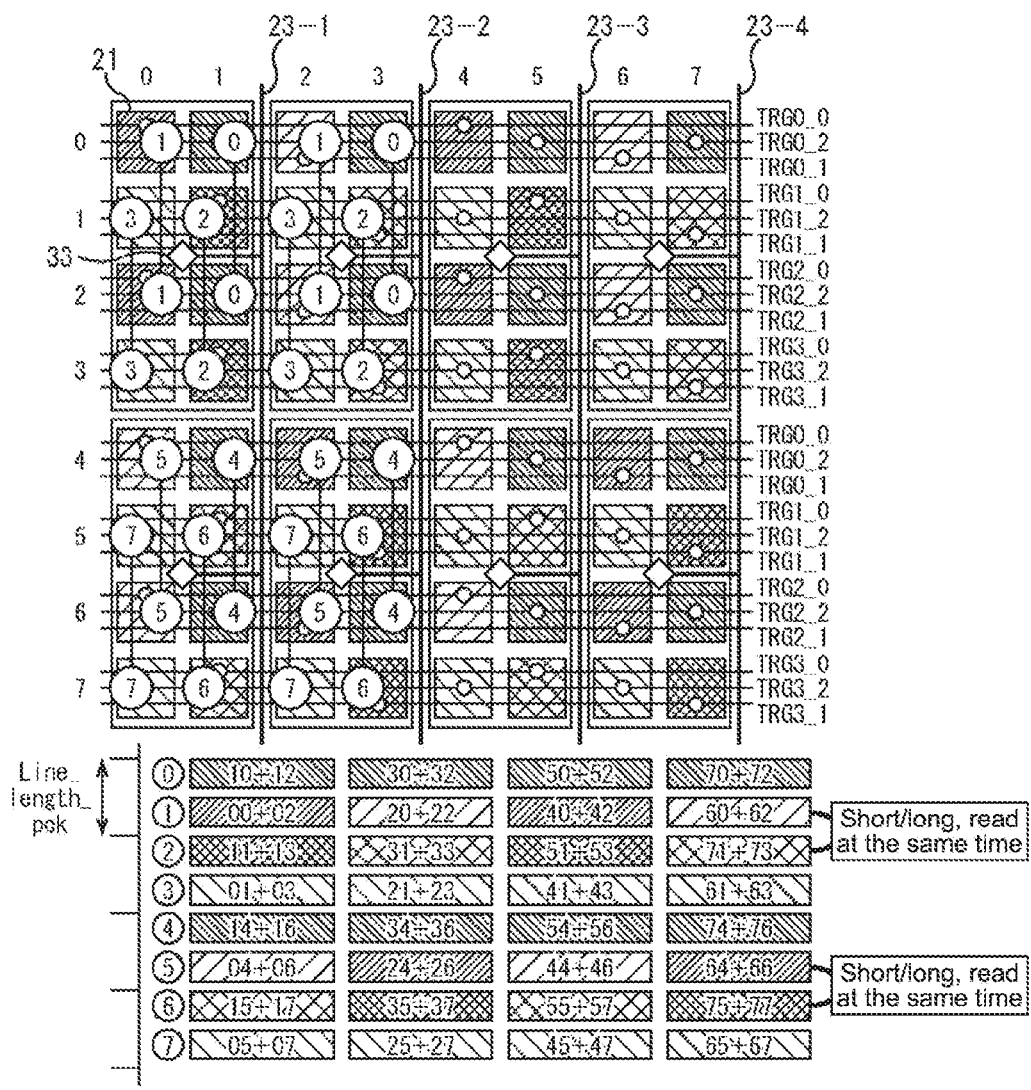
FIG. 7 is a drawing for explaining a read-out method to read out a pixel signal by performing a pixel addition in an FD when an HDR image is captured.

Referring to FIG. 6 and FIG. 7, the read-out method to read out the pixel signal will be described when the HDR image is captured in the solid-state imaging device 11.

In FIG. 6 and FIG. 7, each pixel 21 is represented by a square rectangle, a part of the pixels 21 (eight columns from 0th to 7th in a vertical direction, and eight rows from 0th to 7th in a horizontal direction) disposed at the pixel region 12 of the solid-state imaging device 11 are shown. Here, the pixel of the 0th in the vertical direction and 0th in the horizontal direction is referred to as a pixel 21 (00), the pixel of the 0th in the vertical direction and 1st in the horizontal direction is referred to as a pixel 21 (10), and the pixel of the 1st in the vertical direction and 0th in the horizontal direction is referred to as a pixel 21 (01). Hereinafter similarly, the pixel of the 7th in the vertical direction and 7th in the horizontal direction is referred to as a pixel 21 (77).

The solid-state imaging device 11 adopts a pixel co-structure including eight pixels 21, i.e., four pixels in the vertical direction and two pixels in the horizontal direction sharing the FD 33. Further, in FIG. 6 and FIG. 7, white circled numbers added to the pixels 21 represent orders of reading out the pixel signal, the pixel signals read out according to the reading out order are shown under the vertical signal lines 23-1 to 23-4, respectively.

FIG. 6 shows the read-out method to read out each pixel signal of all pixels 21.

In the read-out method shown in FIG. 6, the pixel signals to which the long-time exposure is applied are read-out from the order 0 to the order 3, and the pixel signals to which the short-time exposure is applied are read-out from the order 4 to the order 7.

For example, in the order 0, the pixel signal of the pixel 21 (00) is read-out via the vertical signal line 23-1, the pixel signal of the pixel 21 (22) is read-out via the vertical signal line 23-2, the pixel signal of the pixel 21 (40) is read-out via the vertical signal line 23-3, and the pixel signal of the pixel 21 (62) is read-out via the vertical signal line 23-4. As all these pixel signals are exposed for a long time, the pixel signals having large values are read out in all columns.

Similarly, for example, in the order 4, the pixel signal of the pixel 21 (02) is read-out via the vertical signal line 23-1, the pixel signal of the pixel 21 (20) is read-out via the vertical signal line 23-2, the pixel signal of the pixel 21 (42) is read-out via the vertical signal line 23-3, and the pixel signal of the pixel 21 (60) is read-out via the vertical signal line 23-4. As all these pixel signals are exposed for a short time, the pixel signals having small values are read out in all columns.

Next, FIG. 7 shows the read-out method to read out the pixel signals by performing a pixel addition in the FD 33.

In the read-out method shown in FIG. 7, the pixel signal to which the long-time exposure is applied is read-out in the order 0, the pixel signal to which the long-time exposure is applied and the pixel signal to which the short-time exposure is applied are both read-out in the order 1 and the order 2, and the pixel signal to which the short-time exposure is applied is read-out in the order 3. Similarly, the pixel signal to which the long-time exposure is applied is read-out in the order 4, the pixel signal to which the long-time exposure is applied and the pixel signal to which the short-time exposure is applied are both read-out in the order 5 and the order 6, and the pixel signal to which the short-time exposure is applied is read-out in the order 7.

For example, in the order 1, the pixel signals of the pixel 21 (00) and the pixel 21 (02) are added at the FD 33 and are read-out via the vertical signal line 23-1, and the pixel signals of the pixel 21 (20) and the pixel 21 (22) are added at the FD 33 and are read-out via the vertical signal line 23-2. Also, the pixel signals of the pixel 21 (40) and the pixel 21 (42) are added at the FD 33 and are read-out via the vertical signal line 23-3, and the pixel signals of the pixel 21 (60) and the pixel 21 (62) are added at the FD 33 and are read-out via the vertical signal line 23-4. At this time, the pixel signals of the pixel 21 (00) and the pixel 21 (02), and the pixel signals of the pixel 21 (40) and the pixel 21 (42) are exposed for a long time, and the pixel signals of the pixel 21 (20) and the pixel 21 (22), and the pixel signals of the pixel 21 (60) and the pixel 21 (62) are exposed for a short time.

In this way, when the pixel signal exposed for a long time and the pixel signal exposed for a short time that are adjacent are read-out, i.e., when the pixel signal having a great value and the pixel signal having a small value that are adjacent are read-out, in the related art solid-state imaging device 11', the crosstalk greatly affects, and it is concerned that the pixel signal exposed for a long time adversely affects the pixel signal exposed for a short time.

In contrast, in the solid-state imaging device 11, as described above, the crosstalk characteristic can be improved, thereby avoiding that the pixel signal exposed for a long time adversely affects the pixel signal exposed for a short time. In other words, in the solid-state imaging device 11 adopting the pixel sharing structure, when the HDR image is captured and the read-out method to perform the pixel addition in the FD 33 and read out the pixel signals is carried out, the effect of inhibiting the crosstalk is effectively exerted.

The solid-state imaging device 11 according to the above-described embodiments may be applied to, for example, a variety of electronic apparatuses such as an imaging system such as a digital still camera and a digital video camera, a mobile phone having an imaging function, or other apparatus having imaging function.

Figure 8:
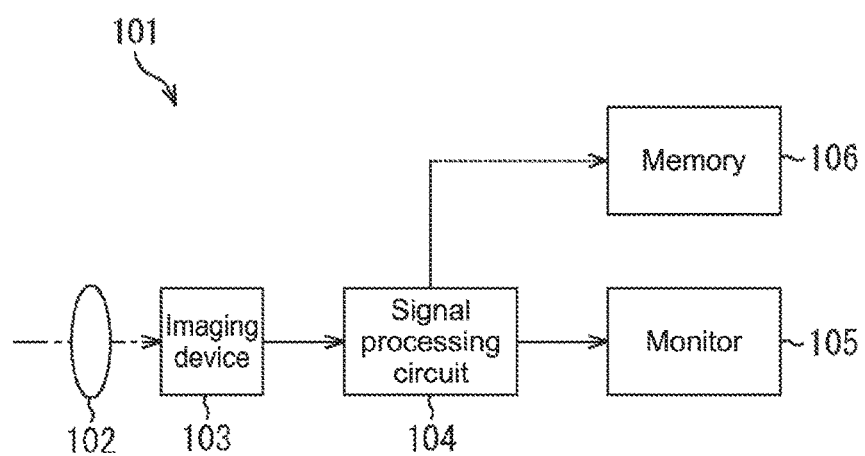
FIG. 8 is a block diagram showing a configuration example of an imaging device mounted to an electronic apparatus.

FIG. 8 is a block diagram showing a configuration example of an imaging device mounted to an electronic apparatus.

As shown in FIG. 8, an imaging apparatus 101 includes an optical system 102, an imaging device 103, a signal processing circuit 104, a monitor 105, and a memory 106, and can capture a still image and a video image.

The optical system 102 includes one or more of lenses, leads image light (incident light) from an object to be imaged to the imaging device 103, and focuses it on a light receiving surface (sensor unit) of the imaging device 103.

As the imaging device 103, the solid-state imaging device 11 according to the above-described embodiments is applied. In the imaging device 103, electrons are accumulated for a certain period of time depending on the image focused on the light receiving surface via the optical system 102. The signal according to the electrons accumulated in the imaging device 103 is fed to the signal processing circuit 104.

The signal processing circuit 104 performs a variety of signal processing to the pixel signal output from the imaging device 103. The resultant image (image data) by performing the signal processing of the signal processing circuit 104 is fed to and displayed on the monitor 105, or fed to and stored (recorded) on the memory 106.

In the imaging apparatus 101 configured in this way, by applying the solid-state imaging device 11 according to the above-described embodiments, the crosstalk characteristic is improved, for example. As a result, an image with a higher quality can be acquired.

The present technology may also have the following configurations.

(1) A solid-state imaging device, including:
a pixel region including a plurality of pixels that output pixel signals corresponding to an amount of irradiated light, the plurality of pixels being disposed in an array;
a column signal processing circuit that AD-converts the pixel signals in parallel by a plurality of AD (Analog to Digital) converters, the number of the plurality of AD converters corresponding to the number of columns of the pixels, and
a reference signal generating circuit that generates a reference signal to which the AD converter refers when the AD converter AD-converts the pixel signals, in which
each of the AD converter includes
a comparator that compares the pixel signal with the reference signal,
a pixel signal side capacitor connected between a pixel-signal signal line that transmits the pixel signals and one input terminal of the comparator, and
a reference signal side capacitor connected between a reference-signal signal line that transmits the reference signal and another input terminal of the comparator, and
the pixel signal side capacitor and the reference signal side capacitor are formed such that a first parasitic capacity generated between a node at a pixel signal line side of the pixel signal side capacitor connected to an adjacent other AD converter and a node at a comparator side of the reference signal side capacitor, and a second parasitic capacity generated between the node at a pixel signal line side of the pixel signal side capacitor connected to the adjacent other AD converter and a node at a comparator side of the pixel signal side capacitor are substantially the same.

(2) The solid-state imaging device according to (1), in which
the pixel signal side capacitor and the reference signal side capacitor are formed to partly and alternately interchange their positions in a planar layout.

(3) The solid-state imaging device according to (1) or (2), in which
a part where the positions of the pixel signal side capacitor and the reference signal side capacitor are interchanged is formed such that a total length of a part of the pixel signal side capacitor being close to the pixel signal side capacitor of the adjacent other AD converter and a total length of a part of the pixel signal side capacitor being close to the pixel signal side capacitor of the adjacent other AD converter are substantially the same.

(4) The solid-state imaging device according to any of (1) to (3), in which
the pixel signal side capacitors and the reference signal side capacitors of the AD converters disposed in odd number columns have a same layout, and the pixel signal side capacitors and the reference signal side capacitors of the AD converters disposed in even number columns have a same layout.

(5) The solid-state imaging device according to any of (1) to (4), in which
a pixel sharing structure including a predetermined number of the pixels sharing a floating diffusion region is adopted, and
a charge is stored in the floating diffusion region to read out a pixel signal when an image representing a wide dynamic range is captured on the basis of a pixel signal read-out from the pixel to which short-time exposure is applied and a pixel signal read out from the pixel to which long-time exposure is applied.

(6) An AD converter, including:
a comparator that compares a first signal with a second signal;
a first signal side capacitor connected between a first-signal signal line that transmits the first pixel signal and one input terminal of the comparator, and
a second signal side capacitor connected between a second-signal signal line that transmits the second signal and another input terminal of the comparator, in which
the first signal side capacitor and the second signal side capacitor are formed such that a first parasitic capacity generated between a node at a first signal line side of the first signal side capacitor connected to an adjacent other AD converter and a node at a comparator side of the second signal side capacitor, and a second parasitic capacity generated between the node at the first signal line side of the first signal side capacitor connected to the adjacent other AD converter
and a node at a comparator side of the first signal side capacitor are substantially the same.

(7) An electronic apparatus, including:
a solid-state imaging device including
a pixel region including a plurality of pixels that output pixel signals corresponding to an amount of irradiated light, the plurality of pixels being disposed in an array;
a column signal processing circuit that AD-converts the pixel signals in parallel by a plurality of AD converters, the number of the plurality of AD converters corresponding to the number of columns of the pixels, and
a reference signal generating circuit that generates a reference signal to which the AD converter refers when the AD converter AD-converts the pixel signals,
each of the AD converters including
a comparator that compares the pixel signal with the reference signal,
a pixel signal side capacitor connected between a pixel-signal signal line that transmits the pixel signals and one input terminal of the comparator, and
a reference signal side capacitor connected between a reference-signal signal line that transmits the reference signal and another input terminal of the comparator,
the pixel signal side capacitor and the reference signal side capacitor being formed such that a first parasitic capacity generated between a node at a pixel signal line side of the pixel signal side capacitor connected to an adjacent other AD converter and a node at a comparator side of the reference signal side capacitor, and a second parasitic capacity generated between the node at the pixel signal line side of the pixel signal side capacitor connected to the adjacent other AD converter and a node at a comparator side of the pixel signal side capacitor are substantially the same.

The present embodiments are not limited to the above-described embodiments, and variations and modifications may be made without departing from the scope of the present disclosure.

REFERENCE SINGS LIST 11 solid-state imaging device
12 pixel region
13 vertical driving circuit
14 column signal processing circuit
15 horizontal driving circuit
16 output circuit
17 ramp signal generating circuit
18 control circuit
21 pixel
22 horizontal signal line
23 vertical signal line
24 AD converter
25 data output signal line
31 PD
32 transfer transistor
33 FD
34 amplification transistor
35 selection transistor
36 reset transistor
41 column
42 constant current source
51 variable current source
52 resistance
53 ramp signal line
61 and 62 capacitor
63 comparator
64 counter
71 and 72 parasitic capacity
81 to 84 metal wiring
85 shield

What is claimed is:

1. A solid-state imaging device, comprising:
a pixel region including a plurality of pixels that output pixel signals corresponding to an amount of irradiated light, the plurality of pixels being disposed in an array;
a column signal processing circuit that AD-converts the pixel signals in parallel using a plurality of AD (Analog to Digital) converters, the number of the plurality of AD converters corresponding to the number of columns of the pixels; and
a reference signal generating circuit that generates a reference signal to which each of the AD converters refers when the AD converters AD-convert the pixel signals, wherein
each of the AD converters includes:
a comparator that compares at least one of the pixel signals with the reference signal;
a pixel signal side capacitor connected between a pixel-signal signal line that transmits the at least one of the pixel signals and one input terminal of the comparator; and
a reference signal side capacitor connected between a reference-signal signal line that transmits the reference signal and another input terminal of the comparator,
wherein the pixel signal side capacitor and the reference signal side capacitor of a first AD converter are formed such that a first parasitic capacity generated between a first node at a pixel signal line side of the pixel signal side capacitor connected to a second AD converter, adjacent to the first AD converter, and a second node at a comparator side of the reference signal side capacitor of the first AD converter, and a second parasitic capacity generated between the first node at and a third node at a comparator side of the pixel signal side capacitor of the first AD converter are substantially the same,
wherein the first node is between the pixel signal side capacitor of the second AD converter and pixels of a first column in the columns connected to the second AD converter,
wherein the second node is between the reference signal side capacitor and the comparator of the first AD converter, and
wherein the third node is between the pixel signal side capacitor and the comparator of the first AD converter.

2. The solid-state imaging device according to claim 1, wherein
each pixel signal side capacitor and each reference signal side capacitor are formed to partly and alternately interchange their positions in a planar layout.

3. The solid-state imaging device according to claim 1, wherein
a part where the positions of each pixel signal side capacitor and each reference signal side capacitor are interchanged is formed such that a total length of a part of the pixel signal side capacitor of the first AD converter that is close to the pixel signal side capacitor of the second AD converter and a total length of a part of the reference signal side capacitor of the first AD converter that is close to the pixel signal side capacitor of the second AD converter are substantially the same.

4. The solid-state imaging device according to claim 1, wherein
the pixel signal side capacitors and the reference signal side capacitors of the AD converters disposed in odd number columns have a same layout, and the pixel signal side capacitors and the reference signal side capacitors of the AD converters disposed in even number columns have a same layout.

5. The solid-state imaging device according to claim 1, wherein the pixel region includes a pixel sharing structure including a predetermined number of the pixels sharing a floating diffusion region, and
wherein charge is stored in the floating diffusion region to read out a pixel signal when an image representing a wide dynamic range is captured on the basis of a pixel signal read-out from a pixel to which short-time exposure is applied and a pixel signal read out from a pixel to which long-time exposure is applied.

6. An AD converter, comprising:
a comparator that compares a first signal with a second signal;
a first signal side capacitor connected between a first-signal signal line that transmits the first pixel signal and one input terminal of the comparator, and
a second signal side capacitor connected between a second-signal signal line that transmits the second signal and another input terminal of the comparator,
wherein the first signal side capacitor and the second signal side capacitor are formed such that a first parasitic capacity generated between a first node at a first signal line side of a third signal side capacitor connected to an adjacent other AD converter and a second node at a comparator side of the second signal side capacitor, and a second parasitic capacity generated between the first node and a third node at a comparator side of the first signal side capacitor are substantially the same, wherein the first node is between the third signal side capacitor and pixels of a first column in the columns connected to the other AD converter, wherein the second node is between the second signal side capacitor and the comparator, and wherein the third node is between the first signal side capacitor and the comparator.

7. An electronic apparatus, comprising:
a solid-state imaging device including:
  a pixel region including a plurality of pixels that output pixel signals corresponding to an amount of irradiated light, the plurality of pixels being disposed in an array;
  a column signal processing circuit that AD-converts the pixel signals in parallel using a plurality of AD converters, the number of the plurality of AD converters corresponding to the number of columns of the pixels; and
  a reference signal generating circuit that generates a reference signal to which each of the AD converters refer when the AD converters AD-convert the pixel signals,
each of the AD converters including:
  a comparator that compares at least one of the pixel signals with the reference signal;
  a pixel signal side capacitor connected between a pixel-signal signal line that transmits the at least one of the pixel signals and one input terminal of the comparator; and
  a reference signal side capacitor connected between a reference-signal signal line that transmits the reference signal and another input terminal of the comparator,
wherein the pixel signal side capacitor and the reference signal side capacitor are formed such that a first parasitic capacity generated between a first node at a pixel signal line side of the pixel signal side capacitor connected to a second AD converter, adjacent to the first AD converter, and a second node at a comparator side of the reference signal side capacitor of the first AD converter, and a second parasitic capacity generated between the first node and a third node at a comparator side of the pixel signal side capacitor of the first AD converter are substantially the same, wherein the first node is between the pixel signal side capacitor of the second AD converter and pixels of a first column in the columns connected to the second AD converter, wherein the second node is between the reference signal side capacitor and the comparator of the first AD converter, and wherein the third node is between the pixel signal side capacitor and the comparator of the first AD converter.

* * * * *